(12) United States Patent
Kim

(10) Patent No.: US 12,566,209 B2
(45) Date of Patent: Mar. 3, 2026

(54) TEST TRAY SYSTEM AND RELATED METHOD

(71) Applicant: GlobalFoundries U.S. Inc., Malta, NY (US)

(72) Inventor: Jae Hoon Kim, Cary, NC (US)

(73) Assignee: GlobalFoundries U.S. Inc., Malta, NY (US)

( * ) Notice: Subject to any disclaimer, the term of this patent is extended or adjusted under 35 U.S.C. 154(b) by 307 days.

(21) Appl. No.: 18/358,101

(22) Filed: Jul. 25, 2023

(65) Prior Publication Data
US 2025/0035700 A1 Jan. 30, 2025

(51) Int. Cl.
G01R 31/28 (2006.01)

(52) U.S. Cl.
CPC ..... G01R 31/2884 (2013.01); G01R 31/2877 (2013.01)

(58) Field of Classification Search
CPC ............ G01R 31/2884; G01R 31/2877; G01R 31/2867; G01R 31/311; G01R 31/2874; G01R 1/0458; H04B 10/07; H04B 10/25; G02B 6/12; G02B 2006/12135
USPC .......................... 324/500, 512, 541, 544, 551
See application file for complete search history.

(56) References Cited

U.S. PATENT DOCUMENTS

| | | | | |
|---|---|---|---|---|
| 7,660,776 B1 * | 2/2010 | Kious | ..................... | G06N 5/025 |
| | | | | 706/45 |
| 10,637,233 B2 * | 4/2020 | Hao | ..................... | H02H 1/0092 |

| | | | | |
|---|---|---|---|---|
| D968,957 S | 11/2022 | Heinle et al. | | |
| 11,719,743 B2 * | 8/2023 | Gopal | ................ | G01R 31/2867 |
| | | | | 324/750.09 |
| 2005/0269242 A1 | 12/2005 | Crisp | | |
| 2015/0355271 A1 * | 12/2015 | Rogel-Favila | ..... | G01R 31/2874 |
| | | | | 324/750.25 |
| 2018/0106851 A1 * | 4/2018 | Schweitzer, III | ...... | H02H 7/261 |
| 2020/0049737 A1 | 2/2020 | Wang et al. | | |
| 2020/0393624 A1 | 12/2020 | Dubey et al. | | |
| 2021/0018560 A1 * | 1/2021 | Tsai | ................... | G01R 31/2875 |

FOREIGN PATENT DOCUMENTS

| | | |
|---|---|---|
| CN | 115201663 A | 10/2022 |
| JP | 2001023992 A | 1/2001 |

OTHER PUBLICATIONS

European Search Report from European Patent Application No. 2415275.8 dated Jul. 15, 2024, 7 pages.
Extended European Search Report dated May 21, 2025 for European Patent Application No. 24152754.8; p. 5.

* cited by examiner

*Primary Examiner* — Giovanni Astacio-Oquendo
(74) *Attorney, Agent, or Firm* — Francois Pagette; Hoffman Warnick LLC

(57) ABSTRACT

A test tray system for electronics, like photonics integrated circuit (PIC) structures, and a related method are disclosed. The test tray system includes at least one test tray. Each test tray includes a first section exposing a first electrical component to a high temperature, and a second section covered by a thermal protection element configured to prevent a second component from being exposed to the high temperature at the same time that the first electrical component is being exposed to the high temperature. The test tray system allows testing of the first component at a high temperature, e.g., 125° C., while protecting the second component from the high temperatures.

20 Claims, 11 Drawing Sheets

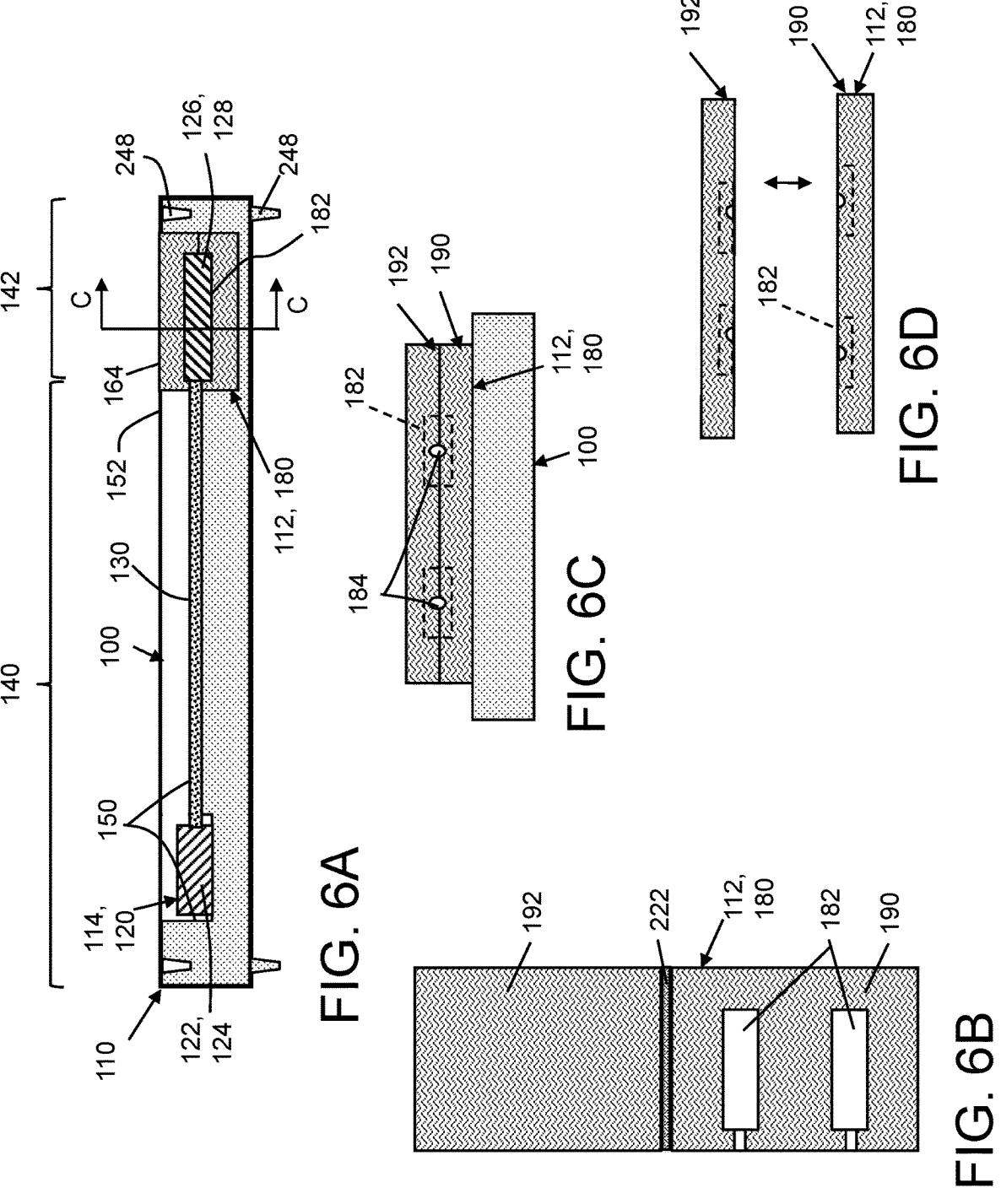

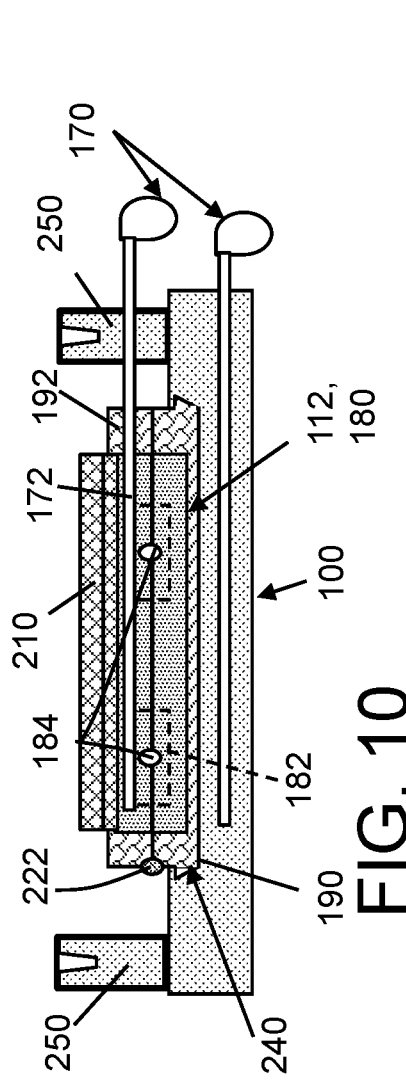
FIG. 10
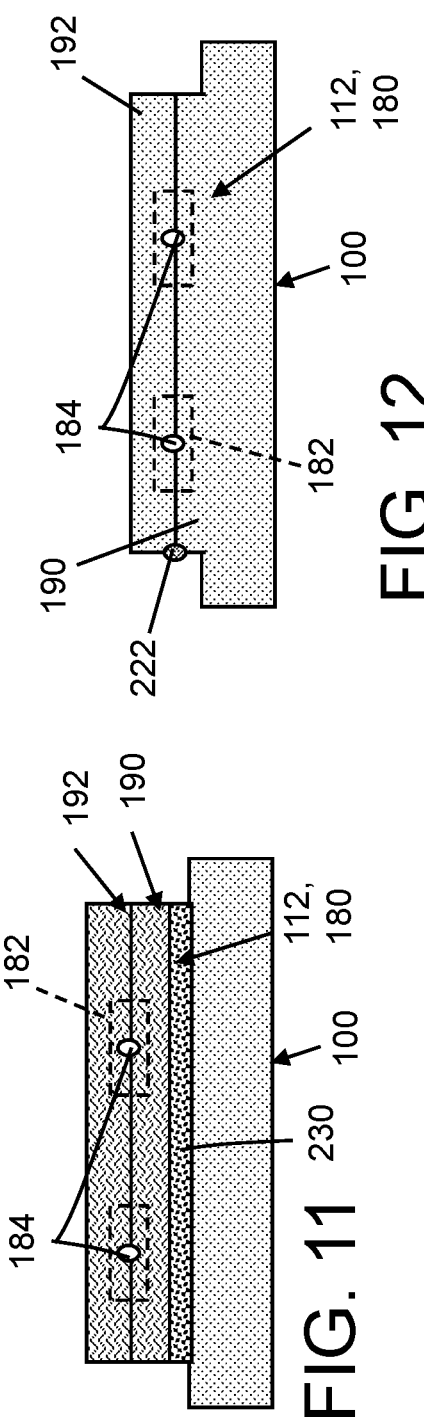
FIG. 12
FIG. 11

TEST TRAY SYSTEM AND RELATED METHOD

BACKGROUND

The present disclosure relates to electronics testing and, more particularly, to a test tray system for testing, for example, photonics integrated circuit (PIC) structures, and a related method.

PIC structures combine integrated circuitry with photonics elements on a single chip. PIC structures can include a PIC module that includes the circuitry and photonics elements. The PIC module is coupled to an optical connector using an optical fiber. The optical connector communicates optical signals to/from the PIC module using the optical fiber. PIC structures are tested at raised temperatures to ensure reliability. For example, current standards for testing PIC modules may require testing at 125° Celsius (C). However, standards for testing optical connectors typically mandate temperatures no higher than 85° C. Current approaches either test the PIC module at 125° C. and either exclude the optical connector or place the optical connector outside of the testing chamber and couple it with a long optical fiber, e.g., one meter long. Another approach performs the test of the PIC structure with a maximum 85° C. temperature. Each of these approaches creates deficiencies in the testing process.

SUMMARY

All aspects, examples and features mentioned below can be combined in any technically possible way.

An aspect of the disclosure provides a test tray system, comprising: at least one test tray including: a first section configured to expose a first electrical component to a high temperature; and a second section covered by a thermal protection element configured to prevent a second component from being exposed to the high temperature at the same time that the first electrical component is being exposed to the high temperature.

An aspect of the disclosure provides a test tray system for a photonics integrated circuit (PIC) structure including a PIC module connected to an optical connector with an optical fiber, the test tray system comprising: at least one test tray including: a first section configured to expose the PIC module to a high temperature; and a second section covered by a thermal protection element configured to prevent the optical connector from being exposed to the high temperature at the same time that the PIC module is being exposed to the high temperature.

An aspect of the disclosure provides a method of testing a photonics integrated circuit (PIC) structure, the method comprising: testing the PIC structure while: exposing a PIC module of the PIC structure in a first section of a test tray to a high temperature; and thermally insulating an optical connector of the PIC structure in a second section of the test tray to prevent the optical connector from being exposed to the high temperature at the same time that the PIC module is exposed to the high temperature, the PIC module coupled to the optical connector by an optical fiber.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein:

FIG. 6A shows a cross-sectional view of a test tray for a test tray system with a thermal protection element according to embodiments of the disclosure;

FIGS. 6B, 6C and 6D shows a top-down view, a first end view and a second, exploded end view of the thermal protection element of FIG. 6A according to embodiments of the disclosure;

FIG. 10 shows a cross-sectional view of a test tray with a thermal protection element with a cooling system in both the test tray and part of the thermal protection element, according to embodiments of the disclosure;

FIG. 11 shows a cross-sectional view of a test tray with a thermal protection element adhered to the tray, according to embodiments of the disclosure;

FIG. 12 shows a cross-sectional view of a test tray integrally formed with a thermal protection element according to embodiments of the disclosure;

Figures 1, 2:
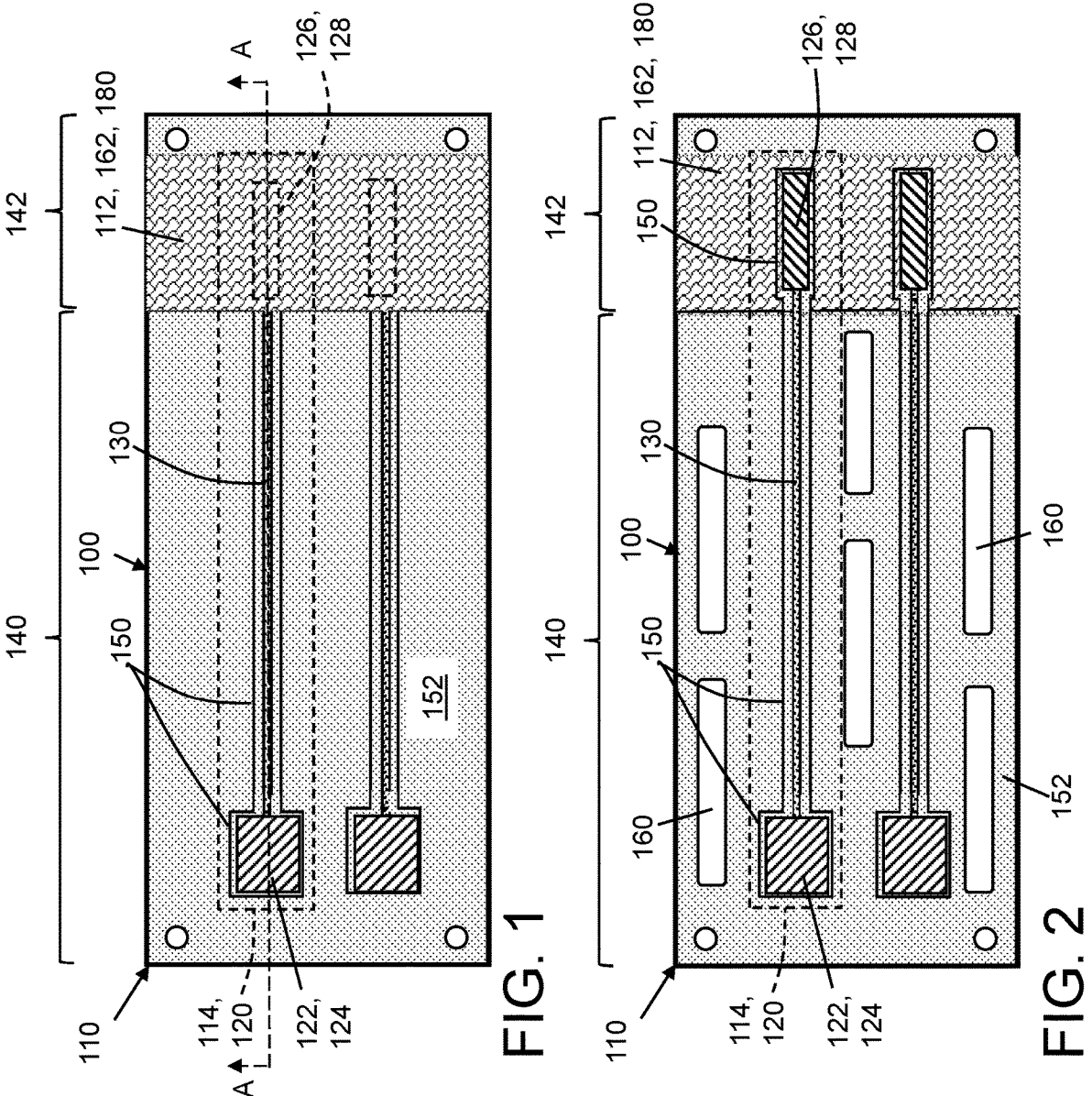
FIG. 1 shows a top-down view of a test tray for a test tray system with a thermal protection element according to embodiments of the disclosure.
FIG. 2 shows a top-down view of a test tray for a test tray system with part of a thermal protection element according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a test tray system for electronic systems, like PIC structures, and a related method. The test tray system includes at least one test tray and may include a plurality of stacked test trays. Each test tray includes a first section exposing a first electrical component, e.g., a PIC module of a PIC structure, to a high temperature, and a second section covered by a thermal protection element configured to prevent a second component, e.g., an optical connector of a PIC structure, from being exposed to the high temperature at the same time that the first electrical component is being exposed to the high temperature. The test tray system allows testing of the first component at a high temperature, e.g., 125° C., while protecting the second component from the high temperatures, e.g., keeping the second component's temperature less than could potentially cause damage thereto, such as less 85° C. The thermal protection element can take a variety of forms. A cooling system may also be used to cool at least the second component. The test tray system allows testing of the first component at a high temperature, e.g., 125° C., while protecting the second component from the high temperatures. In this manner, an operative connector, such as an optical fiber, connecting the components does not have to be elongated to protect the second component by positioning it outside of a test chamber. The thermal protection element may also reduce exposure of the structure under test to vibrations or mechanical damage.

Figures 3, 4:
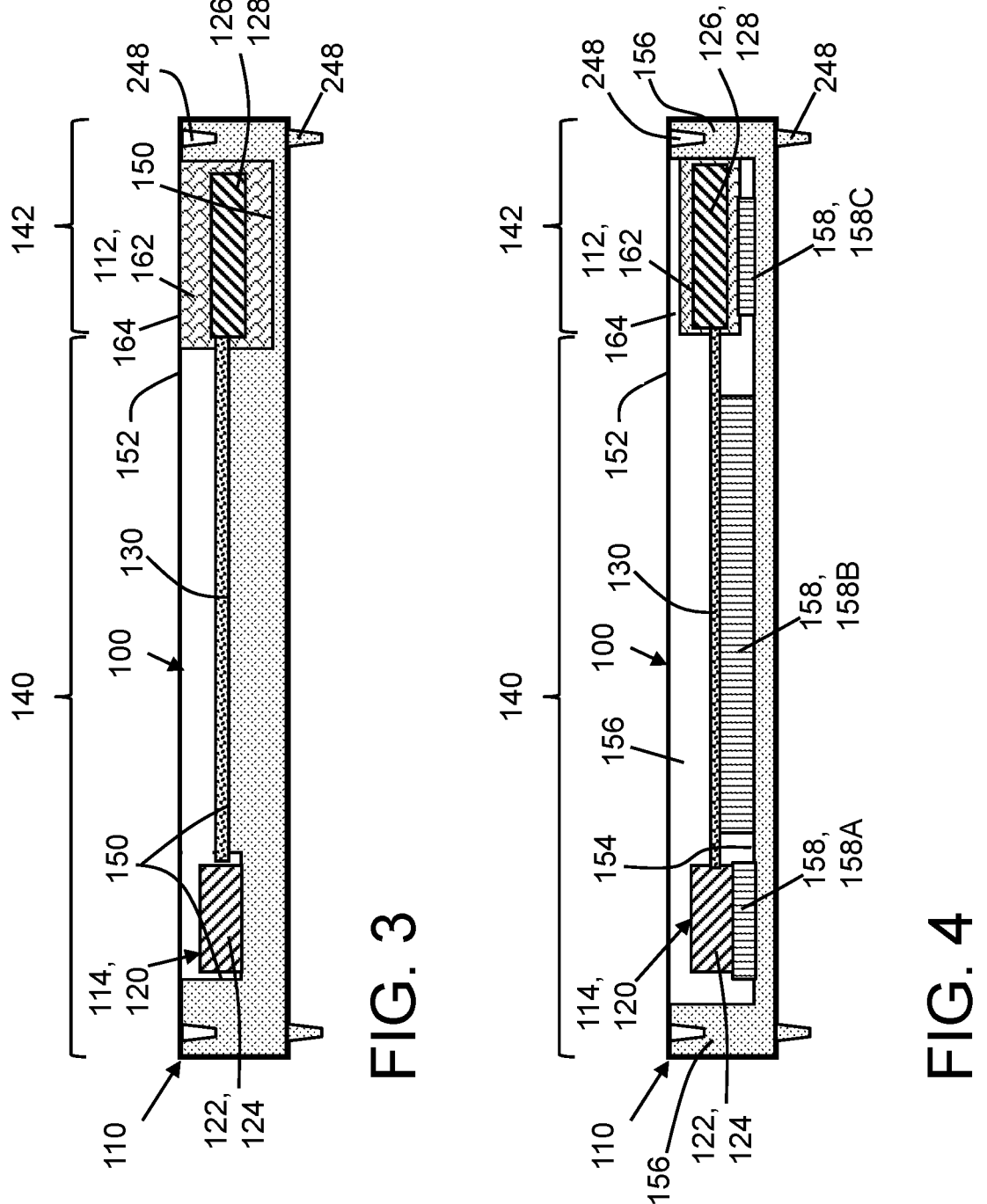
FIG. 3 shows a cross-sectional view of the test tray along view line A-A in FIG. 1 according to embodiments of the disclosure.
FIG. 4 shows a cross-sectional view of the test tray along view line A-A in FIG. 1 according to other embodiments of the disclosure.

FIG. 1 shows a top-down view of a test tray 100 of a test tray system 110 with a thermal protection element 112, FIG. 2 shows a top-down view of test tray 100 with part of a thermal protection element 112 removed, and FIG. 3 shows a cross-sectional view of test tray 100 along view line A-A in FIG. 1, according to embodiments of the disclosure.

Test tray system 110 (hereafter "system 110") includes at least one test tray 100. Each test tray 100 holds a structure 114 (within dashed box in FIGS. 1-2, only one labeled for clarity in FIGS. 1-2) that includes a device having an electrical component to be tested at a high temperature and another component to be protected from the high temperatures at the same time as the electrical component is being tested. In certain embodiments, structure 114 may include a photonics integrated circuit (PIC) structure 120. PIC structure 120 includes a first electronic component 122 in the form of a PIC module 124 and a second component 126 in the form of an optical connector 128. PIC structure 120 may also include an optical fiber 130 optically coupling PIC module 124 and optical connector 128.

PIC module 124 may include any now known or later developed photonics integrated circuit including electrical integrated circuitry and photonics structure for receiving and/or transmitting an optical signal to/from the electrical integrated circuitry. PIC module 124 is to be tested under exposure to high temperatures, e.g., 125° C. or higher. Photonics structure within PIC module 124 may include but is not limited to waveguides, photodetectors, optical absorbers and optical filters. Optical connector 128 may include any now known or later developed optical receiver and/or transmitter for receiving/transmitting an optical signal (e.g., visible or other wavelength light) into or out of optical fiber 130. Optical connector 128 may also operatively connects to a test system for evaluating optical performance, e.g., insertion loss. Optical fiber 130 may include any flexible, transparent fiber capable of transmitting an optical signal therethrough. It is emphasized that structure 114 may include other devices than a PIC structure having another form of electrical component 122 to be test at a high temperature and another form of component 126 to be protected from the high temperatures at the same time that electrical component 122 is being exposed to the high temperature.

Each tray 100 includes a first section 140 and a second section 142. First section 140 exposes first electrical component 122 to a high temperature. More particularly, first section 140 houses electrical component 124 of structure 114 such that the section exposes electrical component 124 to a high temperature. In contrast, second section 142 is covered by or includes thermal protection element 112 that is configured to prevent second component 126 from being exposed to the high temperature at the same time that first electrical component 122 is being exposed to the high temperature. More particularly, second section 142 houses second component 126 of structure 114 within thermal protection element 112. Each tray 100 may also house other structure in either section 140, 142, such as optical fiber 130 in first section 140.

As used herein, "house" indicates tray 100 includes some support structure that allows locating of the respective component and/or element thereon but not necessarily fastening of them to tray 100. For example, as shown in FIGS. 1-3, tray 100 may include a plurality of recesses or openings 150 in a surface 152 thereof, each opening 150 supporting a part of element 112 and/or structure 114. FIG. 4 shows a cross-sectional view of test tray 100 according to other embodiments of the disclosure. In other embodiments, as shown in FIG. 4, tray 100 may include a single recessed surface 154 covering most of tray 100 except sidewalls 156. Tray 100 may also have various supports 158 for supporting parts of element 112 and/or structure 114. For example, a support 158A may support PIC module 124, a support 158B may support optical fiber 130, and a support 158C may support thermal protection element 112 and optical connector 128. Each support 158A-C may have a height within recess 154 to accommodate the part of device 114 it supports. Tray 100 could also include a combination of the arrangements for supporting structure 114 from FIGS. 1-4.

Tray 100 may be made of any material capable of providing the necessary structural rigidity to hold one or more structures 114 and capable of withstanding the testing environment, e.g., temperatures of 125° C. or higher. In non-limiting examples, tray 100 may be made of a plastic capable withstanding a temperature above 125° C.

Tray 100 may optionally include, as shown only in FIG. 2 for clarity, one or more openings 160 therein to, among other things, reduce the amount of material necessary for tray 100 and improve heat transfer during testing. Tray 100 may also include any necessary structure (not shown) to add rigidity, e.g., strengthening or stiffening ribs.

As shown in FIGS. 1-4, tray 100 in system 110 includes thermal protection element 112 configured to prevent second component 126 from being exposed to the high temperature at the same time that first electrical component 120 is being exposed to the high temperature. The thermal protection element 112 can take a variety of forms.

As shown in FIGS. 3-4, thermal protection element 112 may include a thermal insulator layer 162 enclosing second component 126, e.g., optical connector 128. Thermal insulator layer 162 may include any form of flexible insulating material (thermal blanket) such as but not limited to: fiberglass/glass wool, ceramic fiber, air bubble plastic, graphite, polystyrene, polyurethane, cellulose, mineral wool, wool, cementitious foam, and formaldehyde resin, or a combination of these materials. Thermal insulator layer 162 "enclosing" second component 126 means it encloses it in its entirety with no openings or gaps. In other embodiments, however, some small openings or gaps may be possible so long as second component 126 is not impacted by the high temperatures. In certain embodiments, thermal insulator layer 162 may take the form of, for example, a flexible thermal blanket wrapped around second component 126 and made of any of the afore-described materials. As shown in FIGS. 3-4, thermal insulator layer 162 may have an upper surface 164 coplanar with or below upper surface 152 of tray 100 to allow stacking of trays 100; however, this is not necessary in all cases.

Figure 5:
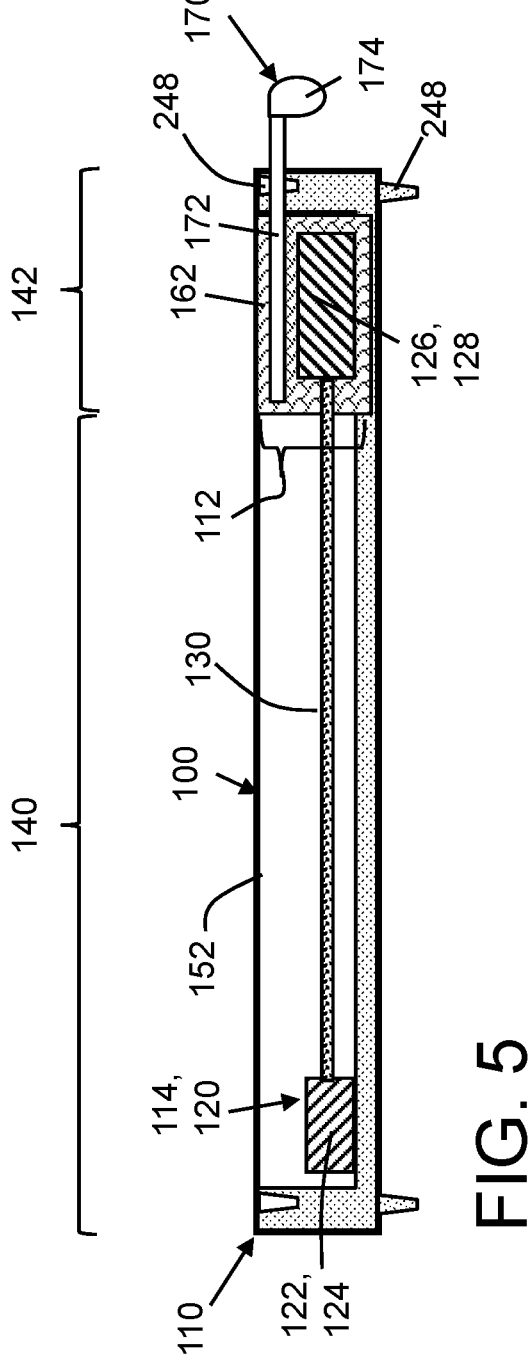
FIG. 5 shows a cross-sectional view of the test tray along view line A-A in FIG. 1 according to additional embodiments of the disclosure.

FIG. 5 shows a side view of tray 100 according to other embodiments of the disclosure. In this embodiment, system 110 also includes a cooling system 170 operatively coupled to thermal protection element 112 to cool at least second component 126. Cooling system 170 can take a variety of forms such as but not limited to: an air-cooling system, a water-cooling system, a cold finger cooling system and/or a thermal electric cooling system. In the example shown, cooling system 170 includes a fluid-based cooling system that uses a fluid coolant, such as air, to cool at least second component 126, e.g., second component 126, thermal protection element 112 and perhaps tray 100. In this case, thermal protection element 112 may include conduit(s) 172 coupled to a fluid coolant source 174 for delivery or passage of the fluid coolant therein to cool at least second component 126. The fluid coolant can take any form capable of thermally communicating heat to protect second component 126 including but not limited to: air; an inert gas such as argon; water; and a thermal fluid (antifreeze) such as propylene glycol. Where a gas, like air, is used, conduit(s) 172 may be open ended into thermal protection element 112. In contrast, where the fluid requires separation from second component 126 to prevent damage to the component, conduit(s) 172 provide a closed circulating system into and out of thermal protection element 112. In a closed circulating system, conduit(s) 172 may be routed in any arrangement through thermal protection element 112, i.e., in a circular or sinusoidal path, to distribute the cooling impact of the fluid coolant. Fluid coolant source 174 may take any form appropriate for the fluid used such as but not limited to a pump, a fan and a pressurized tank of fluid coolant.

FIGS. 6A-D, 7A-D, 8A-D and 9A-D show embodiments of test system 110 in which thermal protection element 112 includes an enclosure 180 enclosing second component 126. (Note, figures labeled 'C' show cross-sectional view along view line C-C in their corresponding set of figures). Enclosure 180 may be differentiated from thermal insulating layer 162 in that it is not as flexible as layer 162. Enclosure 180 may include any necessary positioning structures 182 (see e.g., FIGS. 6B, 7B, 8B, 9B) to position second component 126 therein such as but not limited to, e.g., openings, recesses, seats (shown), vertical posts or other positioning members. Enclosure 180 may also include any necessary openings 184 to allow optical fiber 130 to exit the enclosure.

Enclosure 180 may include, for example, two portions 190, 192 that collectively form enclosure 180. In the figures, portions 190, 192 are shown as two laterally or horizontally extending members that mate along a horizontal line, but other arrangements may be possible, e.g., members mating along a vertical line. Positioning structures 182, e.g., openings, recesses, seats (shown), vertical posts or other positioning members therein, for positioning second component(s) 126 may be in one or both portions 190, 192.

In certain embodiments, as shown in FIGS. 6A-D, enclosure 180 can be made of a single material. In one example, enclosure 180 includes a thermally transmissive material such as a metal, e.g., aluminum, copper, etc. Where metal is used, as an option, a thermally insulative material may be provided inside, such as a layer of polytetrafluoroethylene (PTFE). In other embodiments, shown in FIGS. 7A-D, 8A-D and 9A-D, enclosure 180 can include a number of layers that collectively form a thermal insulated enclosure. In one example, portions 190, 192 include an interior portion 200 of a first material, such as a metal like aluminum or plastic, and an exterior portion 202 of a second material, such as a thermally insulating layer made of any of the materials listed herein for thermal insulating layer 162. Hence, enclosure 180 may include a thermal insulating layer (outer portion 202) and an internal container (inner portion 200 with positioning structure(s) 182). While two layers are shown, enclosure 180 may include any number of layers.

Figures 8A, 8B, 8C, 8D:
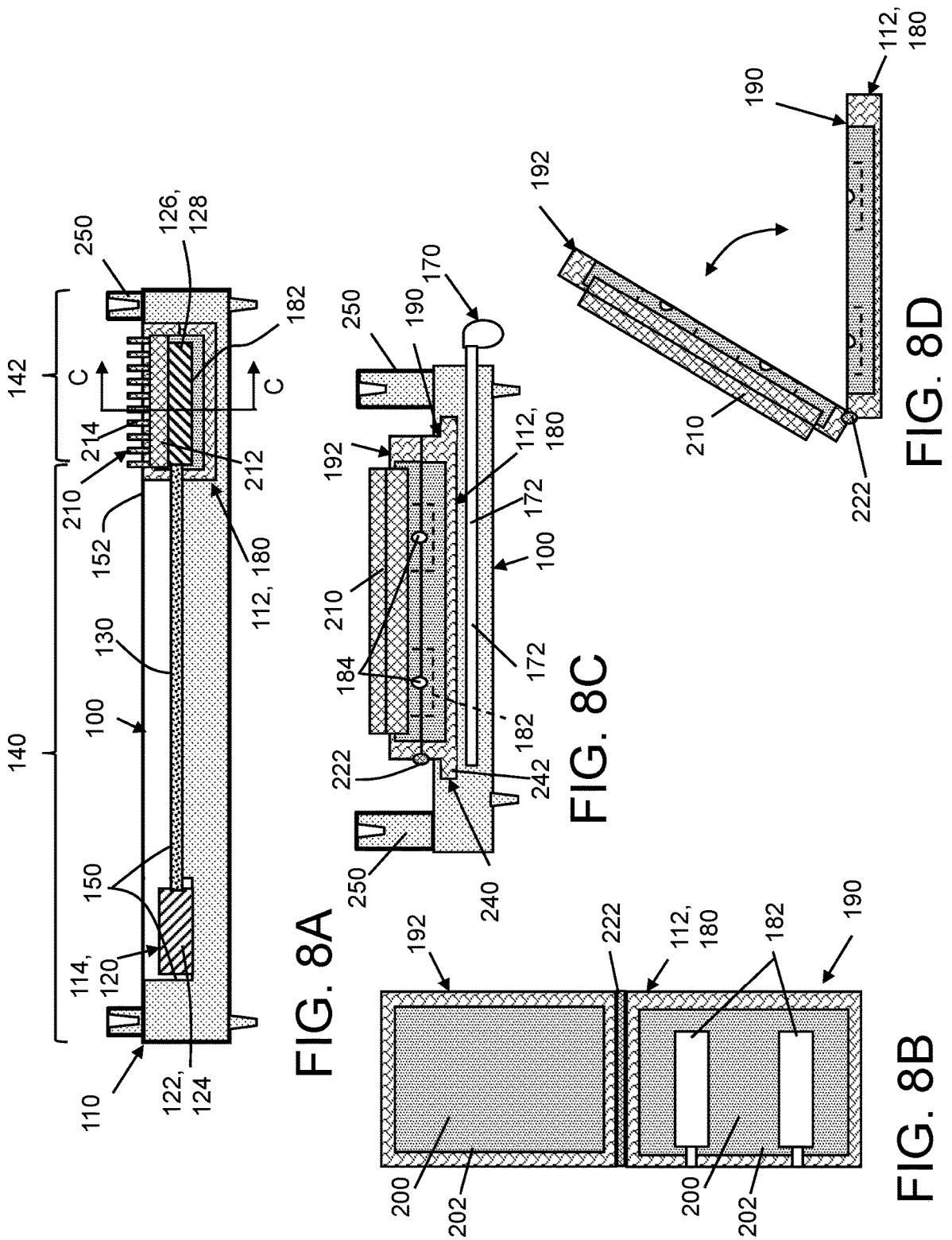
FIG. 8A shows a cross-sectional view of a test tray for a test tray system with a thermal protection element according to embodiments of the disclosure.
FIGS. 8B, 8C and 8D shows a top-down view, a first end view and a second end view of the thermal protection element of FIG. 8A according to embodiments of the disclosure.
Figures 9A, 9B, 9C, 9D:
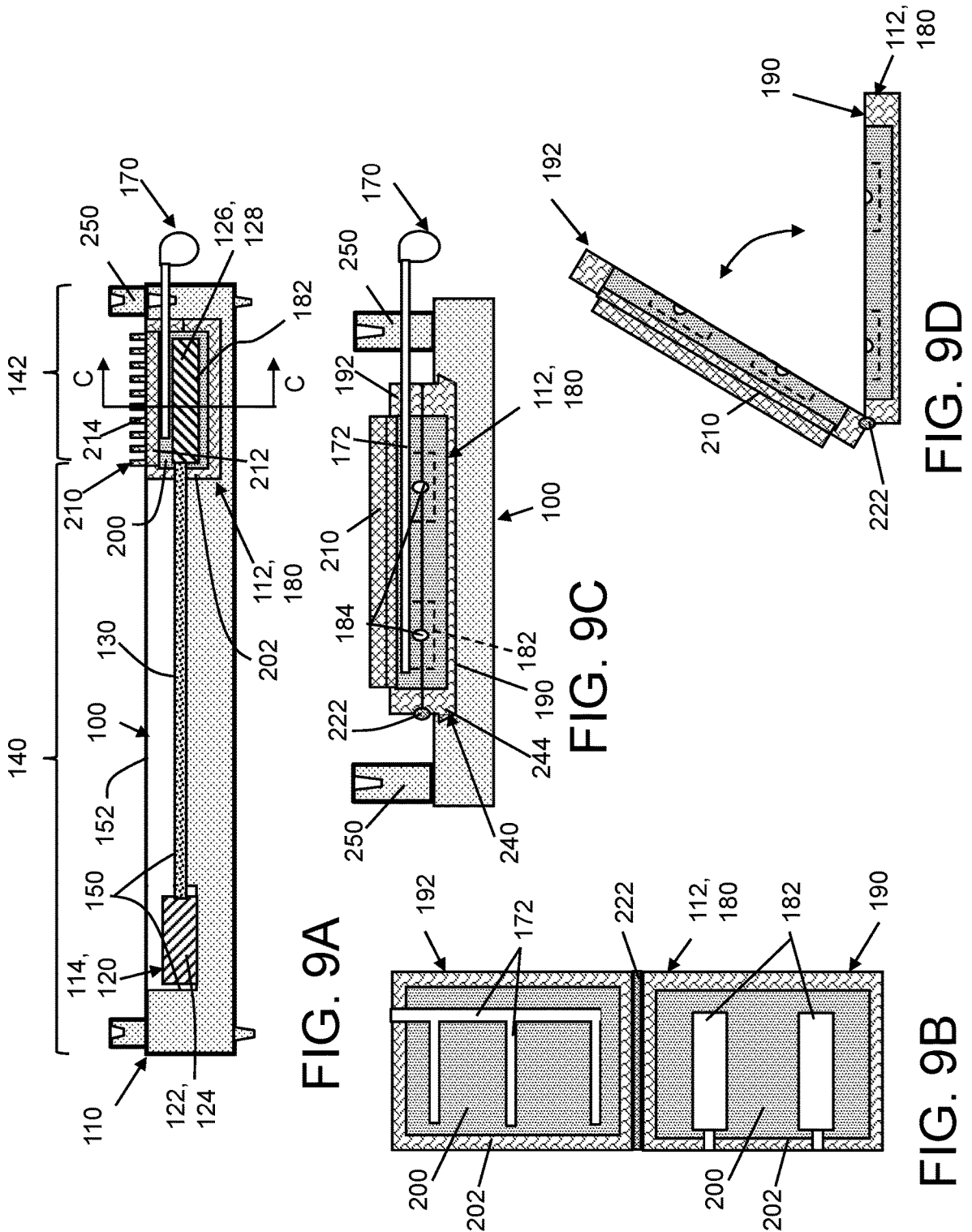
FIG. 9A shows a cross-sectional view of a test tray for a test tray system with a thermal protection element according to embodiments of the disclosure.
FIGS. 9B, 9C and 9D shows a top-down view, a first end view and a second end view of the thermal protection element of FIG. 9A according to embodiments of the disclosure.

As shown in FIGS. 8A-B and D and 9A-B and D, thermal protection element 112 may additionally include a heat exchanger 210 thermally coupled to interior portion 200 (FIGS. 9A, C and D) or second component 126 (FIGS. 8A, C and D), e.g., optical connector 128. Heat exchanger 200 may include any structure capable of thermally removing heat from second component 126. As shown in FIGS. 8A and 9A, heat exchanger 210 may include a base member 212 and a finned structure 214. Base member 210 may be in direct contact with an inner portion 200 (FIG. 9A) (where enclosure 180 includes more than one layer) or second component 126 (FIG. 8A). Finned structure 214 may extend away from base member 212 to thermally interact with the environment within a test container (not shown) in which testing occurs to protect second component 126 from the high temperatures. Heat exchanger 210 can be made of any thermally conductive material such as but not limited to aluminum and copper. While a particular heat exchanger structure has been illustrated, it will be understood that heat exchanger 210 can take a variety of alternative forms.

Portions 190, 192 of enclosure may be positioned together, or they may be coupled together in any manner, e.g., threaded fasteners, releasable snap fasteners, etc. In the example shown in FIGS. 6A-D and 7A-D, portions 190, 192 are positioned together. In FIGS. 6A-D, only the outer sides of portions 190, 192 are used to position them together, and in FIGS. 7A-D, mating sections 220 may be provided to position them together in an aligned manner. Mating sections 220 may include any manner of aligning structures, such as but not limited to joining and alignment parts (e.g., mating male/female, peg and hole or tongue and groove joints) (as shown). Any fastener can be used to hold portions 190, 192 together, if desired. In the example shown in FIGS. 8A-D and 9A-D, portions 190, 192 are pivotally coupled together by a hinge 222. In this example, portions 190, 192 may pivotally open and close for placement or removal of second component(s) 126 therein. It will be recognized that other mechanisms may be possible to position portions 190, 192 of enclosure 180 together.

Any of the embodiments of enclosure 180, shown in FIG. 6A-D, 7A-D, 8A-D or 9A-D, may also include a cooling system 170, as described herein. In this embodiment, system 110 also includes a cooling system 170 operatively coupled to enclosure 180 to cool at least second component 126. For clarity, cooling system 170 is only shown in FIGS. 8C and 9A-C. As noted, cooling system 170 may include a fluid-based cooling system that uses a fluid coolant, such as air, to cool at least second component 126, e.g., second component 126, thermal protection element 112 and perhaps tray 100. In FIGS. 9A-C, passages 172 of cooling system 170 are positioned in portion 192 of enclosure 180 (which is fluidly coupled to heat exchanger 210). Portion 192 includes at least one passage 172 configured to receive a fluid coolant. An exit of passage(s) 172 (not shown) may be provided to allow escape of fluid coolant to within enclosure 180, or passage(s) 172 may provide a closed circulating system depending on the type of fluid coolant. Passage(s) 172 of cooling system 170 may be provided in one or more of portions 190, 192 of enclosure 180, within any layer of portions 190, 192 of enclosure 180, and/or within heat exchanger 210 (where provided) coupled to a part of enclosure 180 or second component 126.

As shown in FIG. 8C, cooling system 170, as described herein, can also be provided in tray 100. As shown in cross-sectional view of FIG. 10, cooling system 170 can also be provided in both tray 100 and thermal protection element 112. Passage(s) 172 can take any form as described herein.

Figures 7A, 7B, 7C, 7D:
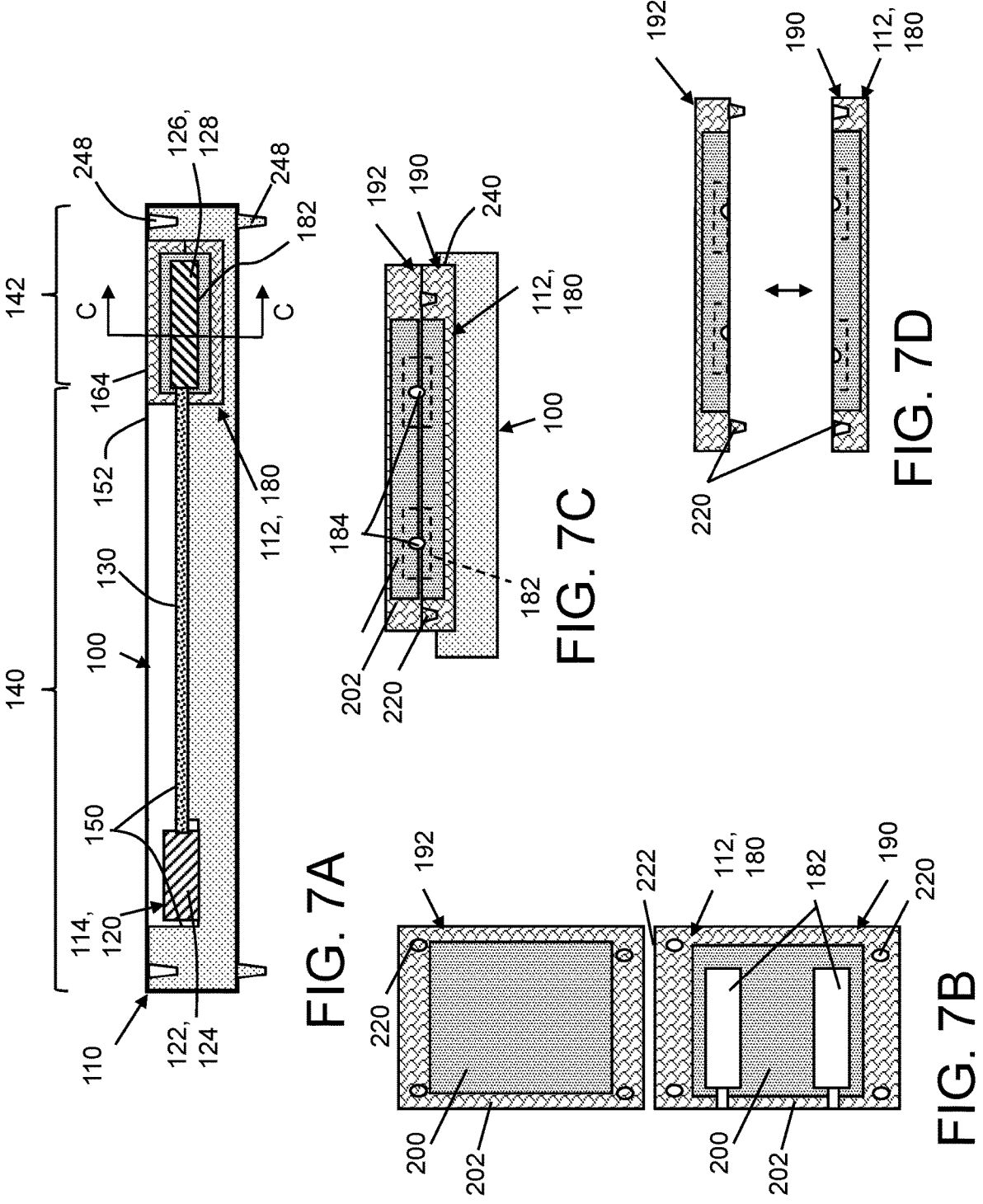
FIG. 7A shows a cross-sectional view of a test tray for a test tray system with a thermal protection element according to embodiments of the disclosure.
FIGS. 7B, 7C and 7D shows a top-down view, a first end view and a second, exploded end view of the thermal protection element of FIG. 7A according to embodiments of the disclosure.

Thermal protection element 112, e.g., enclosure 180, can be arranged relative to tray 100 in a number of ways. In FIGS. 6A and 6C and 7A and 7C, thermal protection element 112 in the form of enclosure 180 is positioned on tray 100. In FIGS. 6A and 6C, thermal protection element 112 rests on tray 100. In FIGS. 7A and 7C, thermal protection element 112 rests in a seat or recess 240 in tray 100. Seat or recess 240 may be part of opening 150, described herein, or may be separate seat or recess in upper surface 152 of tray 100. In other embodiments, thermal protection element 112 may be fastened to tray 100 in a variety of ways. FIGS. 11-12 show cross-sectional views similar to FIGS. 6C, 7C, 8C and 9C. FIG. 11 shows an embodiment similar to FIGS. 6C, but thermal protection element 112 is adhered to tray 100 using an adhesive 230. Adhesive 230 may include any adhesive and is preferably thermally communicative. An adhesive may also be used in the FIGS. 7A and 7C embodiment. With reference again to FIGS. 8C and 9C, in other embodiments, thermal protection element 112 may be fastened to tray 100 using mating recesses. FIG. 8C shows a tongue-and-groove sliding mating elements 242, and FIG. 9C shows snap together mating elements 244. As will be recognized, there are a variety of alternative approaches, not described herein for brevity, in which thermal protection element 112 and tray 110 may be coupled together, such as but not limited to other snap together fasteners, threaded fasteners, male-female and other mating surfaces, and straps.

In another embodiment, shown in FIG. 12, thermal protection element 112 (enclosure 180) and tray 100 are formed as a single piece of material, e.g., of a plastic. In the example shown, portion 190 and tray 100 may be all one piece, e.g., of an injection molded plastic, portion 192 may be separated connected, e.g., by hinge 222, or may also be formed with portion 190, hinge 222 and tray 100 as all one piece, e.g., of an injection molded plastic.

Figure 13:
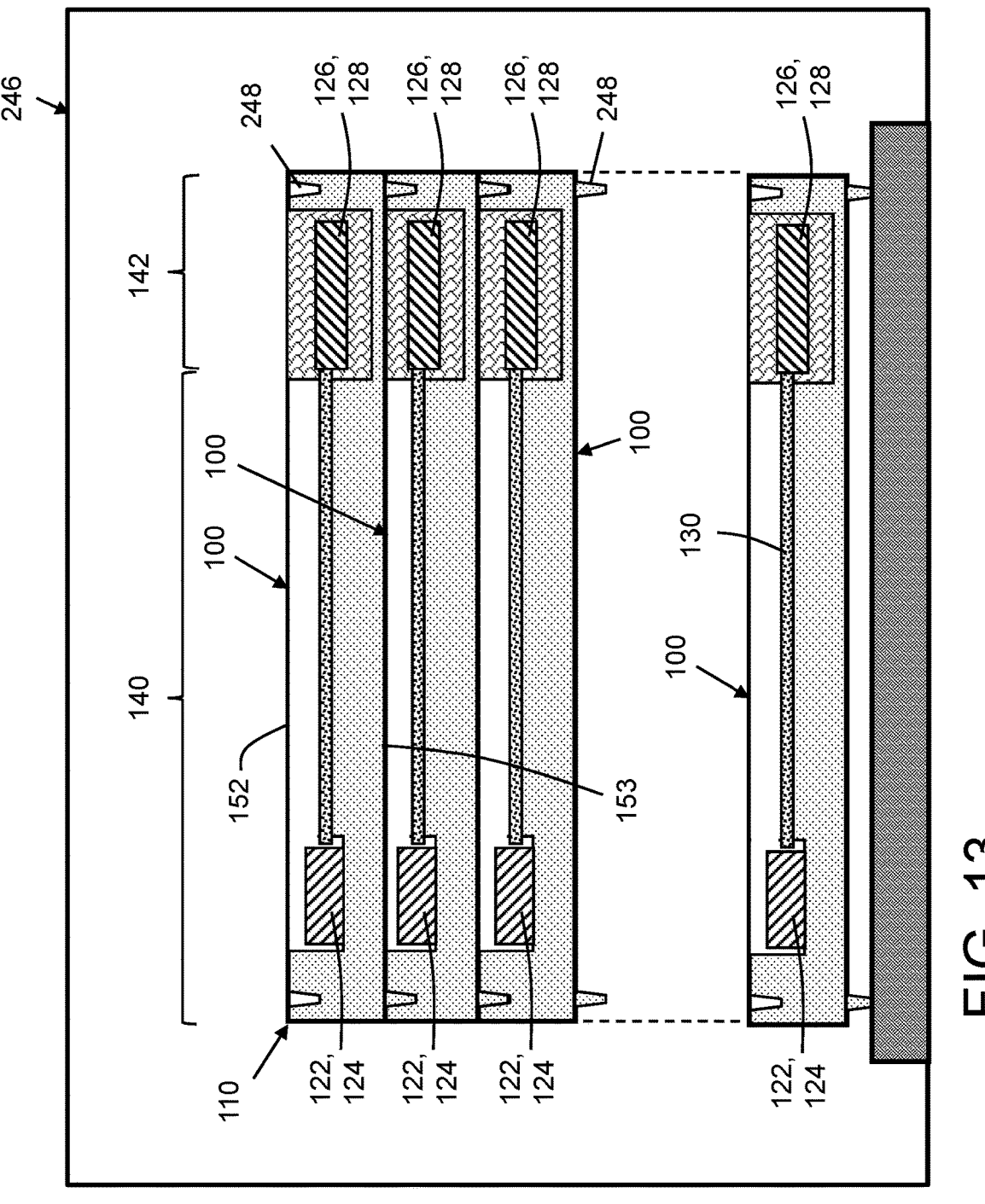
FIG. 13 shows a cross-sectional view of a test tray system with a plurality of stacked test trays in a test chamber and a method according to embodiments of the disclosure.
Figure 14:
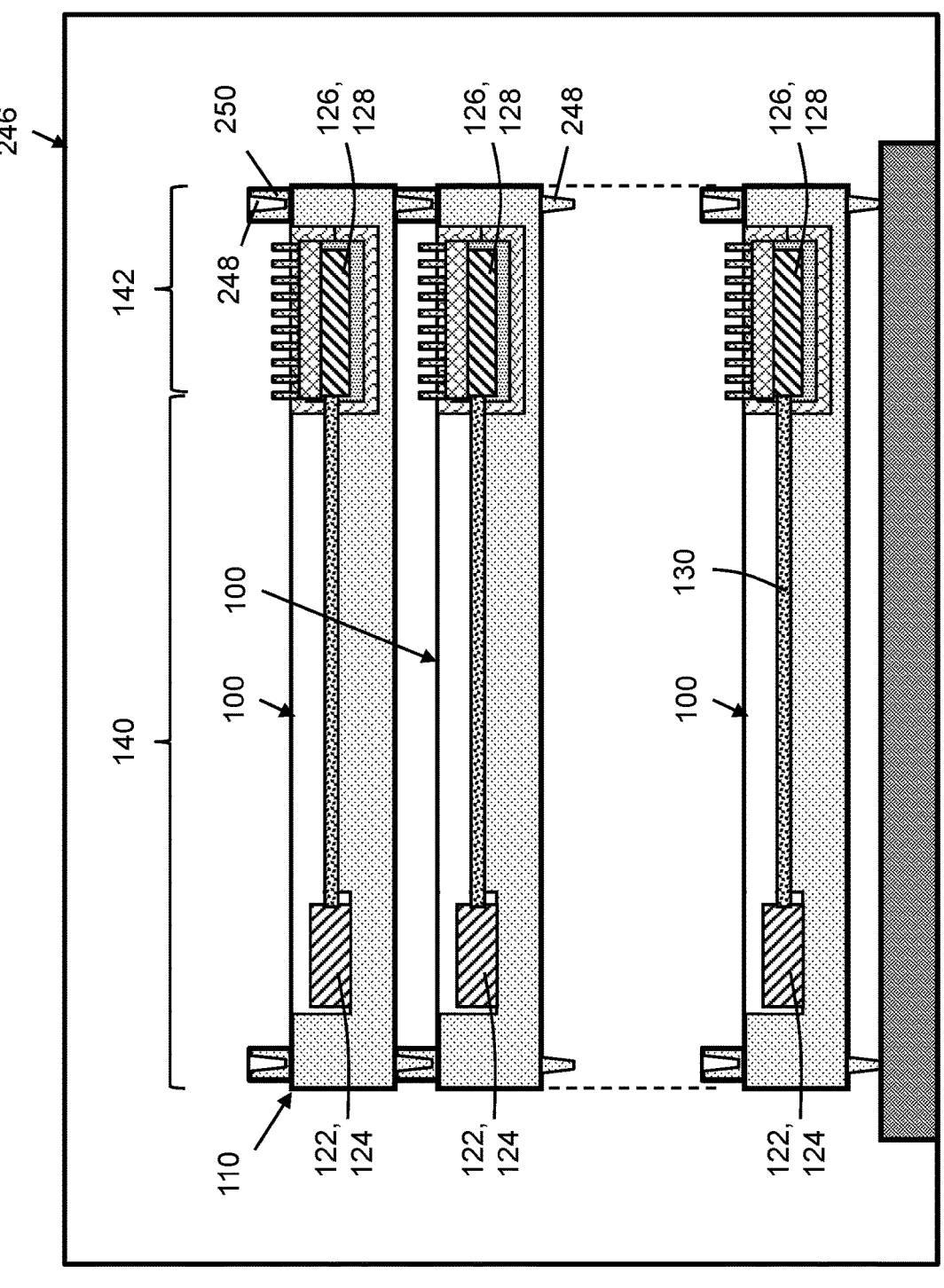
FIG. 14 shows a cross-sectional view of a test tray system with a plurality of stacked test trays in a test chamber and a method according to other embodiments of the disclosure.

FIGS. 13 and 14 show cross-sectional views of tray system 110 with a plurality of stacked trays 110 in a test chamber 246. Test chamber 246 may include any now known or later developed testing systems for electronic components, such as a PIC structure 120. Test chamber 246 is capable of providing the high temperature environment, e.g., ≥125° C., and the electronic connections and controls to run testing of first electric component 122. As the details of such systems are well known, no further details are necessary.

Trays 100 may be simply stacked together, one atop the other, and placed in test chamber 246. Alternatively, each test tray 100 may include stacking structure 248 configured to position each test tray 100 to stack with an adjacent test tray 100 of the plurality of test trays. In the examples in the drawings, stacking structures 248 may include mating elements, e.g., mating male-female connectors or other structure (similar to that described relative to portions 190, 192 of enclosure 180) to ensure alignment of trays 100. In FIGS. 1-5, 6A, 7A, thermal protection element 112 does not extend above upper surface 152 of tray 100, i.e., it is coplanar with or below upper surface 152. In this case, trays 100 can be stacked upper surface 152 to lower surface 153 (only shown for top tray 100 in FIG. 13). As shown in FIGS. 8A, 8C, 9A and 9C, where heat exchanger 210 or any other structure of thermal protection element 112 extends above upper surface 152 of tray 100, tray 100 can include separators or risers 250 that space adjacent trays 110 apart a sufficient distance to accommodate, e.g., a part of thermal protection element 112. Risers 250 may include any stacking structures 248 such as mating elements, as described herein. FIG. 14 shows a plurality of trays 100 stacked together using risers 250.

Figure 15:
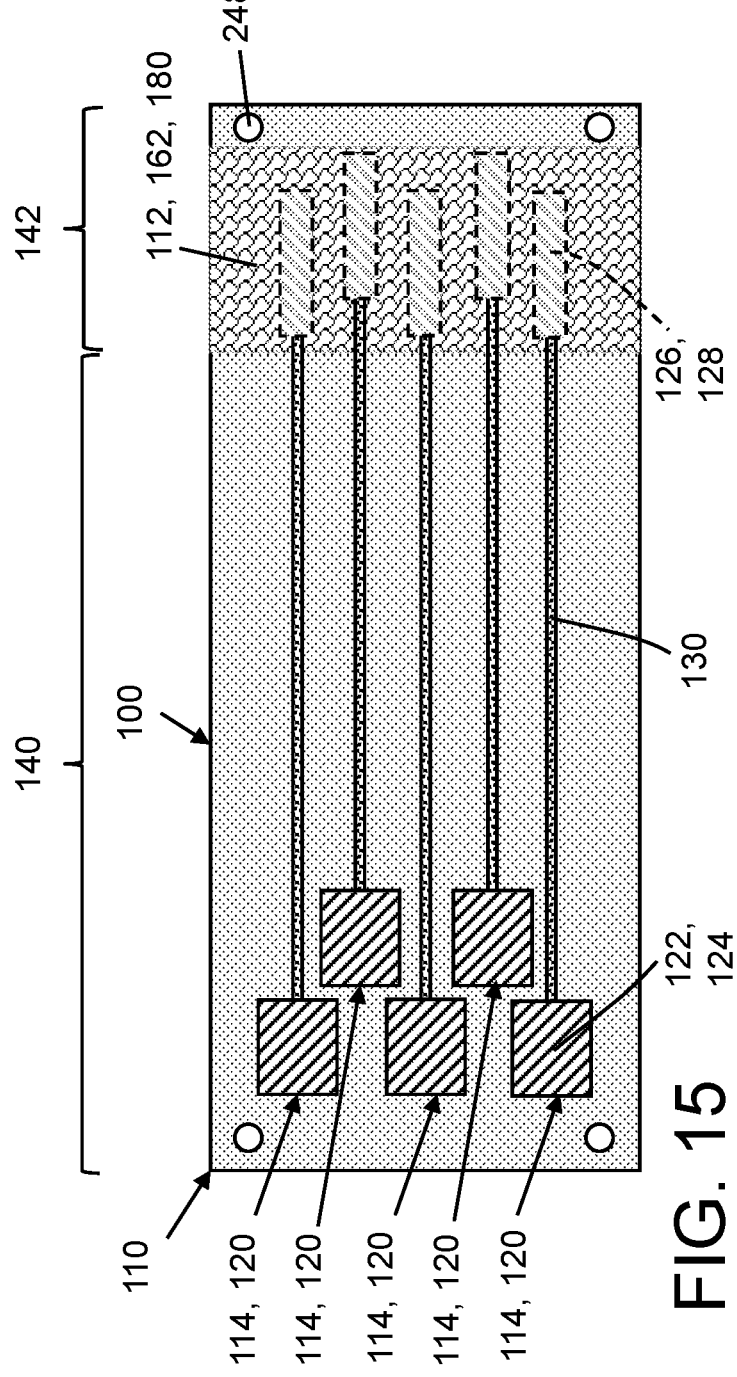
FIG. 15 shows a top-down view of a plurality of structures to be tested on a test tray of a test system according to embodiments of the disclosure.

While the description has been illustrated with trays 100 that include two structures 114, e.g., PIC structures 120, thereon, trays 100 can include any number of structures 114. FIG. 15 shows a top-down view of another example of how devices 114 can be arranged on a tray 100 to increase the number of structures 114 that can be tested on each tray. In any event, first section 140 exposes a plurality of first electrical components 122 to the high temperature and thermal protection element 112 prevents a plurality of second components 126 from being exposed to the high temperature at the same time that plurality of first electrical components 122 are being exposed to the high temperature.

Thermal protection element 112 may thermally insulate structures 114 collectively, e.g., with an enclosure 180 enclosing more than one structure. Alternatively, each structure 114 may include its own thermal protection element 112.

Embodiments of the disclosure also include test tray system 110 for a PIC structure 120 including a PIC module 124 connected to optical connector 128 with optical fiber 130, as described herein.

Referring to FIGS. 13 and 14, in operation, a method of testing PIC structure 120 according to embodiments of the disclosure may include testing PIC structure 120 while: exposing PIC module 124 of PIC structure 120 in first section 140 of test tray 100 to a high temperature, e.g., ≥125° C., and thermally insulating optical connector 128 of PIC structure 120 in second section 142 of test tray 100 to prevent optical connector 128 from being exposed to the high temperature at the same time that PIC module 124 is exposed to the high temperature. PIC module 124 is coupled to optical connector 128 by optical fiber 130. As described herein and shown in FIGS. 1-5, in certain embodiments, the thermally insulating may include using thermal insulator layer 162 enclosing optical connector 128. As also described herein and shown in, for example, FIGS. 6A-D, 7A-D, 8A-D and 9A-D, in certain embodiments, the thermally insulating may include enclosing optical connector 128 in a thermally insulated enclosure 180. Any of the described embodiments may also include cooling at least optical connector 128 with cooling system 170.

Embodiments of the disclosure provide various technical and commercial advantages, examples of which are discussed herein. The test tray system with thermal protection element allows testing of the first component at a high temperature, e.g., 125° C., while protecting the second component from the high temperatures. In this manner, an operative connector, such as an optical fiber, connecting the components does not have to be elongated to protect the second component by positioning it outside of a test chamber. The thermal protection element may also reduce exposure of the structure under test to vibrations or mechanical damage.

The structure and method as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A test tray system, comprising:

at least one test tray including:

a first section configured to expose a first electrical component to a high temperature; and a second section covered by a thermal protection element configured to prevent a second component from being exposed to the high temperature at the same time that the first electrical component is being exposed to the high temperature.

2. The test tray system of claim 1, wherein the thermal protection element includes a thermal insulator layer enclosing the second component.

3. The test tray system of claim 1, wherein the thermal protection element includes an enclosure enclosing the second component.

4. The test tray system of claim 3, wherein the enclosure includes a thermally insulated enclosure including a thermal insulating layer over an inner container.

5. The test tray system of claim 3, further comprising a cooling system operatively coupled to the enclosure to cool at least the second component.

6. The test tray system of claim 5, wherein the cooling system uses a fluid coolant to cool at least the second component.

7. The test tray system of claim 1, further comprising a cooling system operatively coupled to the thermal protection element to cool at least the second component.

8. The test tray system of claim 1, wherein the first electrical component includes a photonics integrated circuit (PIC) module and the second component includes an optical connector, wherein the PIC module and the optical connector are connected by an optical fiber.

9. The test tray system of claim 1, wherein the at least one test tray includes a plurality of test trays, each test tray including a stacking structure configured to position the test tray to stack with an adjacent test tray of the plurality of test trays.

10. The test tray system of claim 1, wherein the first section exposes a plurality of first electrical components to the high temperature; and the thermal protection element prevents a plurality of second components from being exposed to the high temperature at the same time that the plurality of first electrical components is being exposed to the high temperature.

11. A test tray system for a photonics integrated circuit (PIC) structure including a PIC module connected to an optical connector with an optical fiber, the test tray system comprising:

at least one test tray including:

a first section configured to expose the PIC module to a high temperature; and a second section covered by a thermal protection element configured to prevent the optical connector from being exposed to the high temperature at the same time that the PIC module is being exposed to the high temperature.

12. The test tray system of claim 11, wherein the thermal protection element includes a thermal insulator layer enclosing the optical connector.

13. The test tray system of claim 11, wherein the thermal protection element includes a thermally insulated enclosure including a thermal insulating layer over an inner container.

14. The test tray system of claim 13, further comprising a cooling system operatively coupled to the thermally insulated enclosure to cool at least the optical connector.

15. The test tray system of claim 11, further comprising a cooling system operatively coupled to the thermal protection element to cool at least the optical connector.

16. The test tray system of claim 11, wherein the at least one test tray includes a plurality of test trays, each test tray including a stacking structure configured to position the test tray to stack with an adjacent test tray of the plurality of test trays.

17. A method of testing a photonics integrated circuit (PIC) structure, the method comprising:

exposing a PIC module of the PIC structure in a first section of a test tray to a high temperature;

thermally insulating an optical connector of the PIC structure in a second section of the test tray to prevent the optical connector from being exposed to the high temperature at the same time that the PIC module is exposed to the high temperature, the PIC module coupled to the optical connector by an optical fiber; and testing the PIC structure at the same time that the PIC module is exposed to the high temperature and the optical connector is thermally insulated.

18. The method of claim 17, wherein thermally insulating includes using a thermal insulator layer enclosing the optical connector.

19. The method of claim 17, wherein thermally insulating includes enclosing the optical connector in a thermally insulated enclosure.

20. The method of claim 17, further comprising cooling at least the optical connector with a cooling system.

* * * * *